United States Patent
Bae et al.

(10) Patent No.: US 7,642,106 B2
(45) Date of Patent: Jan. 5, 2010

(54) METHODS FOR IDENTIFYING AN ALLOWABLE PROCESS MARGIN FOR INTEGRATED CIRCUITS

(75) Inventors: Choel-Hwyi Bae, Gyeonggi-do (KR); You-Seung Jin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 12/046,065

(22) Filed: Mar. 11, 2008

(65) Prior Publication Data

US 2008/0224134 A1    Sep. 18, 2008

(30) Foreign Application Priority Data

Mar. 12, 2007    (KR)    ............... 10-2007-0023809

(51) Int. Cl.
   *H01L 21/66*    (2006.01)
(52) U.S. Cl. ............... 438/18; 438/17; 438/14; 438/E21.524; 257/48
(58) Field of Classification Search ............ 438/14–18; 257/48; 324/395–399
   See application file for complete search history.

(56) References Cited

U.S. PATENT DOCUMENTS 6,921,672 B2 *  7/2005  Satya et al. ............ 438/18
6,949,765 B2    9/2005  Song et al.

2004/0207414 A1    10/2004    Verma et al.

FOREIGN PATENT DOCUMENTS

JP    2002-026100    1/2002

* cited by examiner

*Primary Examiner*—Dung A. Le
(74) *Attorney, Agent, or Firm*—Myers Bigel Sibley & Sajovec

(57) ABSTRACT

A test structure for inspecting an allowable process margin in a manufacturing process for a semiconductor device is provided. The test structure includes a plurality of grounded conductive lines on a substrate and electrically grounded to the substrate. A plurality of floating conductive lines are provided, each of the plurality of conductive lines being spaced apart from the grounded conductive lines and electrically separated from the grounded conductive lines on the substrate. A plurality of supplementary patterns are provided for measuring the allowable process margin by a voltage contrast between the grounded conductive lines and the floating conductive lines. Related methods of testing are also provided.

16 Claims, 12 Drawing Sheets

METHODS FOR IDENTIFYING AN ALLOWABLE PROCESS MARGIN FOR INTEGRATED CIRCUITS

CLAIM OF PRIORITY

This application claims priority under 35 U.S.C. § 119 to Korean Patent Application No. 2007-23809, filed on Mar. 12, 2007 in the Korean Intellectual Property Office (KIPO), the contents of which are herein incorporated by reference in their entirety.

FIELD OF THE INVENTION

The present invention relates generally to semiconductor devices and, more particularly to, test structures for semiconductor devices and related methods of testing.

BACKGROUND OF THE INVENTION

As semiconductor devices are becoming more highly integrated, design specifications for the devices, such as design rule, critical dimensions (CD) and contact area, are becoming gradually reduced. For this reason, electronic circuits on substrates are becoming more and more complicated, and circuit-packing densities for the substrates are gradually increasing. High circuit packing density requires high operation precision in each unit process for manufacturing the semiconductor devices, and thus detection technology for detecting defects in the electronic circuits is becoming more and more sophisticated.

A test element group (TEG) inspection technology has been suggested for improving the accuracy and efficiency of a detection process. A test structure including various TEGs is formed on a test chip, and processing defects in the electronic circuits are detected by an in-line detection process that is performed with respect to the test structure simultaneously with the manufacturing process for the semiconductor device. The above TEG inspection technology is performed through an electrical process, and thus shows accurate information on whether or not defects exist in the electronic circuits. However, there is a problem in that the TEG inspection technology cannot provide any further information on detected defects such as the kinds, locations and causes of the defects.

In order to solve the above problems of the TEG inspection technology, a voltage contrast inspection technology has been used instead of the TEG inspection technology. According to the voltage contrast inspection technology, charged particles such as electron beams and ion beams are irradiated onto the test chip, to thereby form a data image of the TEG illustrating the voltage contrast of the TEG on the test chip. The data image is compared with a reference image illustrating the voltage contrast of a reference TEG having no defects, to thereby detect processing defects in the electronic circuits of the devices. That is, the voltage contrast inspection technology detects the defects using the charged particles instead of the electrical process. The voltage contrast inspection technology provides accurate information on the kinds, locations and causes of the defects, as well as the defects themselves.

For example, United States Patent Publication No. 2003/0001598 (Assignee: KLA-Tencor Corp., U.S.A.) discusses the voltage contrast inspection technology based on a density of secondary electrons. The secondary electrons emitted from a test structure including grounded conductive lines and floating conductive lines are detected and the processing defects of TEGs are inspected using voltage contrast between the grounded conductive lines and the floating conductive lines based on the density of the detected secondary electrons. The voltage contrast inspection technology of the above United States patent publication can detect physical defects, such as a shape deformation of a circuit pattern, as well as electrical defects, such as electrical openings or shorts.

Referring now to FIG. 1, a view illustrating a test structure for a conventional voltage contrast inspection technology will be discussed. As illustrated in FIG. 1, a test structure 10 for the conventional voltage contrast inspection technology includes a plurality of grounded conductive lines 12 and floating conductive lines 14. For example, each of the grounded conductive lines 12 includes a metal wiring grounded to a substrate through a contact plug, and each of the floating conductive lines 14 includes a conductive line electrically insulated from the metal wiring by a dielectric layer.

Electron beams are irradiated onto the test structure 10 including the grounded conductive lines 12 and the floating conductive lines 14 so as to detect processing defects in the test structure 10 using the voltage contrast inspection technology.

Processing defects in the test structure 10 are detected by an assessment scan of the electron beam that is irradiated onto the test structure 10 in a vertical direction to the conductive lines 12 and 14, and locations of the detected processing defects are identified by an identification scan of the electron beam that is irradiated onto the test structure 10 in a direction parallel with the grounded conductive lines 12, to thereby determine the kinds and locations of the processing defects.

When the electron beams are irradiated onto the test structure 10, a plurality of secondary electrons is generated from the conductive lines 12 and 14 of the test structure. The secondary electrons, which are generated from the grounded conductive lines 12, flow into a ground sink and form an electron flow from the conductive lines 12 to the ground sink. Thus, the electron flow through the grounded conductive lines 12 is detected to have a relatively large voltage. In contrast, the secondary electrons, which are generated from the floating conductive lines 14, cannot flow into the ground sink and flow only in the floating conductive lines 14, because the floating conductive lines 14 are electrically isolated from other portions of the test structure 10. Thus, the electron flow through the floating conductive lines 14 is detected to have a relatively small voltage. The detected voltages are visually shown as a bright portion 22 and a dark portion 24 in a voltage contrast image 20 in accordance with each of the conductive lines 12 and 14. The bright portion 22 of the voltage contrast image 20 corresponds to the voltage of the electron flow through the normal grounded conductive lines 12 having no processing defects therein, and the dark portion 24 of the voltage contrast image 20 corresponds to the voltage of the electron flow through the normal floating conductive lines 14 having no processing defects therein.

The grounded conductive lines 12 and the floating conductive lines 14 are alternately positioned in the test structure 10 and are spaced apart from each other by a predetermined distance, and thus the bright portions 22 and the dark portions 24 are also alternately arranged and spaced apart by the same distance as the conductive lines 12 and 14 if the conductive lines 12 and 14 have no processing defects. That is, when the conductive lines 12 and 14 have no processing defects therein, a pair of the bright and dark portions 22 and 24 is periodically repeated in the voltage contrast image 20 in accordance with each of the conductive lines 12 and 14. Therefore, the assessment scan to the test structure 10 may find a break point at which the alternating arrangement and periodicity of the bright and dark portions 22 and 24 of the voltage contrast image 20 is broken, and may determine which of the conductive lines 12 and 14 has processing defects.

For example, when an electrical short is generated between the grounded conductive lines 12 and the floating conductive lines 14 adjacent to each other, the floating conductive lines 14 are electrically grounded to the ground sink through the grounded conductive lines 12. For that reason, the floating conductive lines 14 including electrical short defects are represented as bright portions, as shown in a first portion A of the voltage contrast image 20, even though the floating conductive lines 14 including no defects should be represented as dark portions. Furthermore, when each of the grounded conductive lines 12 includes an opening, a portion of each of the grounded conductive lines 12 is electrically isolated from the other portion thereof, and each of the grounded conductive lines 12 works similarly to the floating conductive lines 14. As a result, the grounded conductive lines 12 including opening defects are represented as dark portions, as shown in a second portion B of the voltage contrast image 20, even though the grounded conductive lines 12 including no defects should be represented as bright portions.

Thereafter, the identification scan is performed along the conductive lines including defects, to thereby determine the locations and causes of the detected defects. The identification scan is usually performed in an analysis system including a focused ion beam (FIB) unit and a scanning electron beam (SEB).

The above assessment scan and identification scan are performed in a real-time process simultaneously with every unit process of a semiconductor manufacturing process, so that the inspection process is performed simultaneously with the manufacturing process of the semiconductor device.

However, the above voltage contrast inspection technology provides accurate information on the processing defects generated in each of the unit processes of the manufacturing process for the semiconductor device, but typically does not provide any information on a process margin of each of the unit processes.

In general, the processing defects, which may reduce a production yield of a semiconductor device, are classified into random defects caused by particles or voids, and system defects caused by insufficient transcription of a layout for a circuit pattern. Random defects represent all kinds of the processing defects that are randomly and unintentionally generated in the unit processes of the manufacturing process for the semiconductor device, and includes electrical or physical defects caused by random particles or random voids that are unintentionally generated in the manufacturing process.

System defects represent all kinds of defects caused by discrepancies between a circuit layout and a circuit pattern that is transcribed from the circuit layout in a unit process, so that the system defects are mainly influenced by an allowable error range or a process margin of the unit process. When a circuit pattern is formed to have smaller critical dimensions (CD) using a usual apparatus for the unit process having conventional specifications and operational characteristics, the layout for the circuit pattern may be difficult to accurately transcribe onto a substrate, to thereby increase the possibility of system defects due to the poor accuracy of the transcription. As the degrees of integration of recent semiconductor devices are being improved, each unit process for manufacturing the semiconductor device is required to be performed more accurately. Accordingly, there may be a higher possibility of system defects being generated due to discrepancies between the circuit pattern on a substrate and the circuit layout.

The conventional defect inspection technology discussed above has been good for detecting random defects that have already been generated in a unit process; however, the conventional defect inspection technology generally cannot provide any information on system defects that may be generated after the unit process has been completed. Furthermore, a recent manufacturing process has a higher chance of generating system defects due to high process accuracy that is required for patterns having reduced CDs and line widths.

Random defects have already been generated in a unit process, and thus the inspection technology for random defects is focused on detection of the defects. In contrast, system defects are caused by incomplete transcription of the layout onto the substrate, and thus the inspection technology for system defects is focused on obtaining a sufficient allowable error range or process margin. The system defects as well as the random defects can have a higher effect on the production yield of semiconductor devices as the degree of integration increases and the line width of the semiconductor devices decreases.

SUMMARY OF THE INVENTION

Some embodiments of the present invention provide a test structure for inspecting an allowable process margin in a manufacturing process for a semiconductor device. The test structure includes a plurality of grounded conductive lines on a substrate and electrically grounded to the substrate. A plurality of floating conductive lines are provided, each of the plurality of conductive lines being spaced apart from the grounded conductive lines and electrically separated from the grounded conductive lines on the substrate. A plurality of supplementary patterns are provided for measuring the allowable process margin by a voltage contrast between the grounded conductive lines and the floating conductive lines.

In further embodiments of the present invention, the grounded conductive lines and the floating conductive lines may not include opening defects and are alternately arranged in a first direction on the substrate. The test structure may further include a plurality of inspection units on the substrate along a first direction and spaced apart by a first distance, the plurality of inspection units each including a pair of grounded and floating conductive lines a short-reduction area between the grounded and floating conductive lines.

In still further embodiments of the present invention, the inspection units may further include a plurality of specimen units and a plurality of reference units. Each of the specimen units may have a supplementary pattern in the short-reduction area and may generate a specimen signal and each of the reference units having no supplementary patterns in the short-reduction area and a reference signal that is compared with the specimen signal. The specimen units and the reference units may be alternately arranged and spaced apart by the first distance.

In some embodiments of the present invention, the supplementary patterns in each of the specimen units may include at least a first supplementary conductive line and at least a second supplementary conductive line. The first and second supplementary conductive lines may be parallel to each other, spaced apart by a second distance, and have different sizes in each of the specimen units. The first supplementary conductive line may extend to a first length, smaller than the first distance, from the grounded conductive lines to the floating conductive lines. The second supplementary conductive line may extend to a second length, smaller than the first distance, from the floating conductive lines to the grounded conductive lines.

In further embodiments of the present invention, a width of one of the first and the second supplementary conductive lines or the second distance between the first and second supplementary conductive lines may be different in each of the specimen units if a pitch of the supplementary patterns is maintained constant. The pitch of the supplementary patterns may correspond to a sum of a width of one of the first and the second supplementary conductive lines and the second distance.

In still further embodiments of the present invention, each of the supplementary patterns may further include a third supplementary conductive line between the first and second supplementary conductive lines in parallel such that a first end portion is connected to an end portion of the first supplementary conductive line and a second end portion, opposite to the first end portion, is connected to an end portion of the second supplementary conductive line.

In some embodiments of the present invention, the third supplementary conductive line may be spaced apart from the first and the second supplementary conductive lines by a third distance such that electrical shorts do not occur among the first, the second and the third supplementary conductive lines. A width of the third supplementary conductive line or a third distance may be different in each of the specimen units if a pitch of the supplementary patterns is maintained constant, the pitch of the supplementary patterns corresponding to a sum of the width of the third supplementary conductive line and the third distance.

In further embodiments of the present invention, each of the supplementary patterns may further include a first conductive connector that is electrically connected to the first supplementary conductive line, a second conductive connector that is electrically connected to the second supplementary conductive line and a fourth supplementary conductive line that is electrically connected with the first and the second conductive connectors.

In still further embodiments of the present invention, gap distances between edge portions of the fourth conductive line and the first conductive connector or between edge portions of the fourth conductive line and the second conductive connector may be different in each of the inspection units.

In some embodiments of the present invention, each of the supplementary patterns may include a protrusion from the grounded conductive lines or the floating conductive lines in the short-reduction area, the size of the protrusion being different in each of the inspection units.

In further embodiments of the present invention, a measuring member may be provided that is electrically connected to the grounded conductive lines and the floating conductive lines, the measuring member detecting a direct current passing through the grounded and floating conductive lines.

In still further embodiments of the present invention, the supplementary patterns may include a first conductive plug that is electrically connected to the grounded conductive lines; a second conductive plug that is electrically connected to the floating conductive lines and is spaced apart from the first conductive plug; and an additional conductive line electrically connected to the first and second conductive plugs. The grounded and the floating conductive lines may be electrically connected by the conductive plugs and the additional conductive line may be classified into a plurality inspection units such that the inspection units are spaced apart by a unit gap.

In some embodiments of the present invention, each of the inspection units may include a reference unit for generating a reference signal in which the first and second conductive plugs are spaced apart by a standard gap distance; and a specimen unit for generating a detection signal in which the first and second conductive plugs are spaced apart by a measuring gap distance. The reference unit and the specimen unit may be spaced apart by a line gap distance such that the inspection units and the reference units are arranged alternately on the substrate.

In further embodiments of the present invention, the additional conductive lines of each inspection units may have a same size, and the measuring gap distances of each specimen unit may be different from one another.

In still further embodiments of the present invention, a number of the supplementary patterns on the substrate may be from about $10/\mu m^2$ to about $20/\mu m^2$.

In some embodiments of the present invention, the grounded conductive lines may include a conductive plug that is grounded to the substrate and the floating conductive lines may include a metal wiring that is electrically insulated from the conductive plug by an insulation interlayer.

In further embodiments of the present invention, the grounded and the floating conductive lines may include conductive structures for a semiconductor device.

Still further embodiments of the present invention provide methods for inspecting an allowable process margin in a manufacturing process for a semiconductor device. The method includes irradiating a charged particle beam onto a test structure including a plurality of grounded conductive lines, a plurality of floating conductive lines spaced apart and electrically separated from the grounded conductive lines, and a plurality of supplementary patterns electrically connected to the grounded and the floating conductive lines and having different sizes; inspecting processing defects of the supplementary patterns by detecting electrical signals generated from the grounded and the floating conductive lines due to the charged particle beam; and determining an allowable process margin based on sizes of the supplementary patterns from which the processing defects are inspected.

In some embodiments of the present invention, the charged particle beam may include an electron beam. Inspecting the processing defects may include classifying the grounded and floating conductive lines into a plurality of inspection units, each of which includes a pair of one of the grounded conductive lines and one of the floating conductive lines, a specimen unit having the supplementary patterns and a reference unit having no supplementary patterns; generating a reference signal image corresponding to reference signals generated from the grounded and the floating conductive lines of the reference unit and a specimen signal image corresponding to specimen signals generated from the grounded and the floating conductive lines of the specimen unit; and identifying the supplementary patterns in the specimen unit as defective patterns when the reference signal image and the specimen signal image are different in the inspection unit.

In further embodiments of the present invention, generating the reference signal image and the specimen signal image may include detecting secondary electrons generated from the grounded conductive lines and the floating conductive lines by the electron beam; measuring voltages of the grounded and the floating conductive lines in each of the inspection units; and displaying each of the voltages as a visual image in accordance with the grounded and the floating conductive lines to generate the reference signal image indicating the voltages measured from the grounded and the floating conductive lines of the reference unit, and the specimen signal image indicating the voltages measured from the grounded and the floating conductive lines of the specimen unit.

In still further embodiments of the present invention, the specimen signal image and the reference signal image may be displayed alternately with each other to facilitate voltage contrast analysis between the specimen signal image and the reference signal image adjacent to each other.

In some embodiments of the present invention, identifying the defective patterns may include binary subtraction of the specimen signal image from the reference signal image.

In further embodiments of the present invention, an intensity of a direct current passing through the defective patterns may be measured.

In still further embodiments of the present invention, determining the allowable process margin may include comparing the sizes of defective patterns; and selecting a maximum or a minimum size of the defective patterns.

In some embodiments of the present invention, the supplementary patterns in the specimen unit may include a first supplementary conductive line extending from the grounded conductive lines to the floating conductive lines and a second supplementary conductive line extending from the floating conductive lines to the grounded conductive lines in parallel with the first supplementary conductive line and spaced apart from the first supplementary conductive line by a first distance. The sizes of the defective patterns may be widths of the first and second supplementary conductive lines and the first distance.

In further embodiments of the present invention, each of the supplementary patterns may further include a third supplementary conductive line between the first and second supplementary conductive lines in parallel with the first and the second supplementary conductive lines and spaced apart from the first and the second supplementary conductive lines by a second distance in such a manner that a first end portion is connected to an end portion of the first supplementary conductive line and a second end portion opposite to the first end portion is connected to an end portion of the second supplementary conductive line. Sizes of the defective patterns may be a width of the third supplementary conductive line and the second distance.

In still further embodiments of the present invention, each of the supplementary patterns may further include a first conductive connector that is electrically connected to the first supplementary conductive line, a second conductive connector that is electrically connected to the second supplementary conductive line and a fourth supplementary conductive line that is electrically connected with the first and second conductive connectors. The sizes of the defective patterns may further include a gap distance between edge portions of the fourth conductive line and the first conductive connector or between edge portions of the fourth conductive line and the second conductive connector.

In some embodiments of the present invention, inspecting the processing defects may include classifying the grounded and floating conductive lines into a plurality of inspection units, each of which includes a pair of one of the grounded conductive lines and one of the floating conductive lines, a first conductive plug electrically connected to the grounded conductive lines and a second conductive plug electrically connected to the floating conductive lines, a specimen unit in which the first and second conductive plugs are spaced apart from each other by a standard distance and a reference unit in which the first and second conductive plugs are spaced apart from each other by a reference distance; generating a reference signal image corresponding to a reference signal generated from the reference unit and a specimen signal image corresponding to a specimen signal generated from the specimen unit; and identifying the supplementary patterns in the specimen unit as defective patterns when the reference signal image and the specimen signal image are different from each other in the inspection unit.

In further embodiments of the present invention, generating the reference signal image and the specimen signal image may include detecting secondary electrons generated from the grounded conductive lines and the floating conductive lines by the electron beam; measuring voltages of the grounded and the floating conductive lines in the reference and the specimen units; and displaying each of the voltages as a visual image in accordance with the reference and the specimen units, to thereby generate the reference signal image indicating the voltage measured from the grounded and the floating conductive lines of the reference unit, and the specimen signal image indicating the voltage measured from the grounded and the floating conductive lines of the specimen unit.

In still further embodiments of the present invention, the specimen signal image and the reference signal image may be displayed alternately with each other to facilitate voltage contrast analysis between the specimen signal image and the reference signal image adjacent to each other.

In some embodiments of the present invention, identifying the defective patterns may include a binary subtraction of the specimen signal image from the reference signal image.

In further embodiments of the present invention, determining the allowable process margin may include comparing the measuring gap distances of the defective patterns; and selecting a maximum or a minimum measuring gap distance of the defective patterns.

DESCRIPTION OF THE EMBODIMENTS

Figure 1:
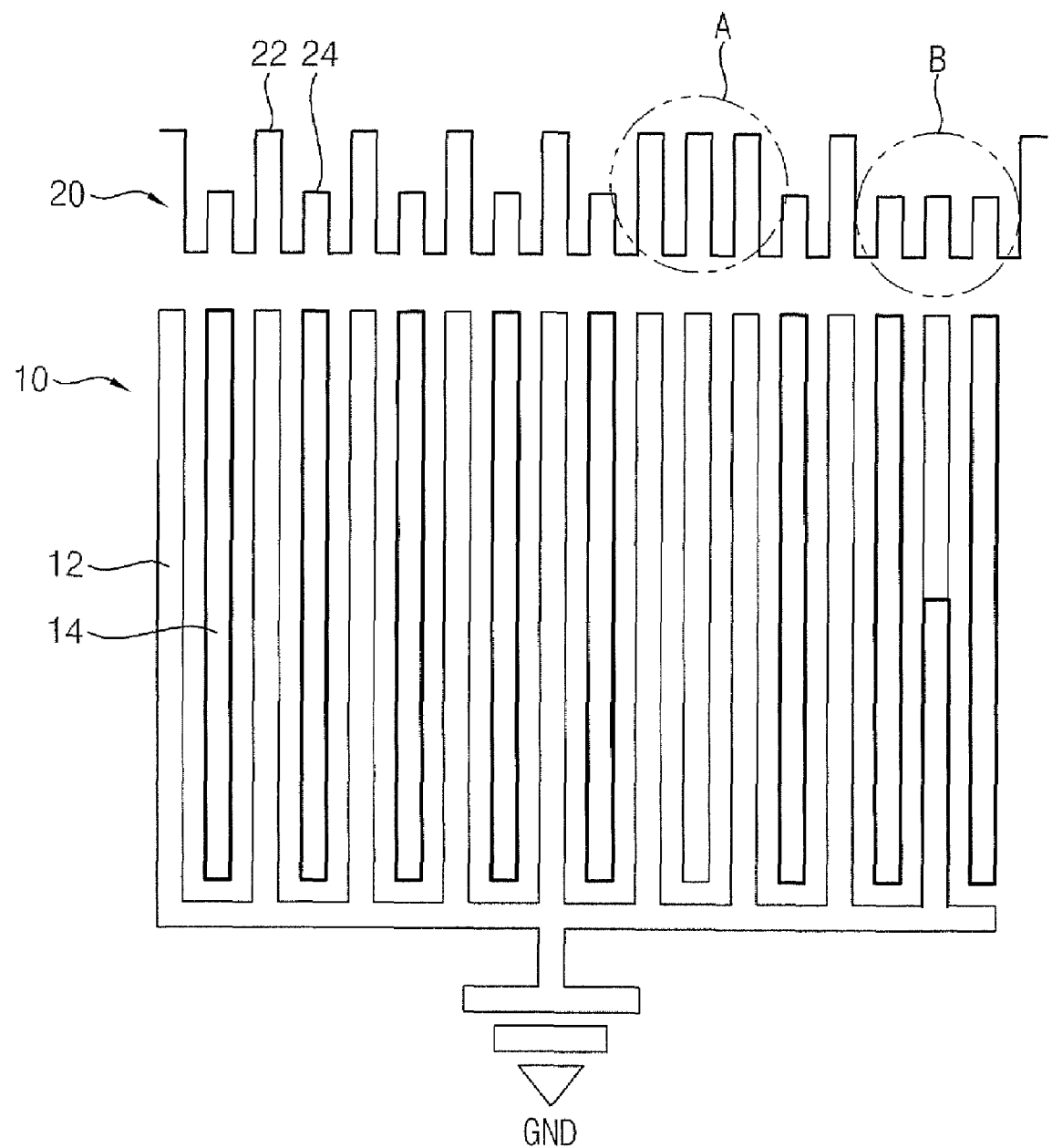
FIG. 1 is a view illustrating a test structure for a conventional voltage contrast inspection technology.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As will be discussed below with respect to FIGS. 2 through 13, some embodiments of the present invention relate to a test structure for identifying an allowable process margin for an integrated circuit and a method of inspecting the allowable process margin using the same. In particular, some embodiments of the present invention relate to a voltage contrast test structure having supplementary patterns of which sizes are different from one another and a method of inspecting the allowable process margin using the voltage contrast test structure.

Figure 2:
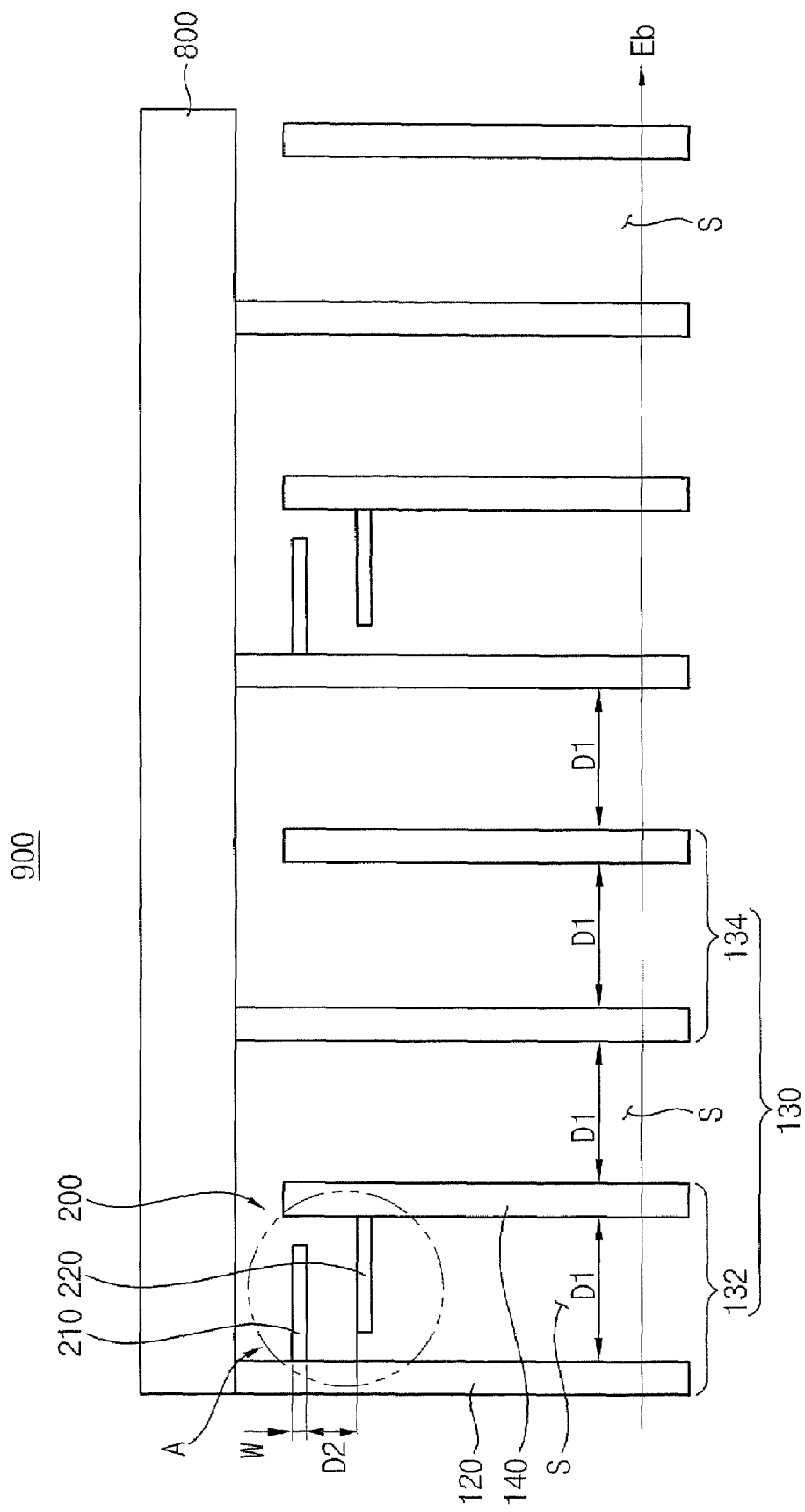
FIG. 2 is a plan view illustrating a test structure for checking an allowable error range or a process margin of a manufacturing process for a semiconductor device by voltage contrast inspection process in accordance with some embodiments of the present invention.

FIG. 2 is a plan view illustrating a test structure for checking an allowable error range or a process margin of a manufacturing process for a semiconductor device by voltage contrast inspection process in accordance with some embodiments of the present invention. As illustrated in FIG. 2, a test structure 900 in accordance with some embodiments of the present invention includes a substrate 800, a plurality of grounded conductive lines 120 on the substrate 800, a plurality of floating conductive lines 140 spaced apart from the grounded conductive lines 120 by a first distance and a plurality of supplementary patterns 200 for inspecting an allowable process margin of a manufacturing process for a semiconductor device by using a voltage contrast between the grounded conductive lines 120 and the floating conductive lines 140.

The substrate 800 includes, for example, a silicon wafer for manufacturing a semiconductor device and a glass substrate for manufacturing an integrated circuit for a flat panel display device. For example, a surface of the wafer may be divided into a plurality of die arrays, and each of the die arrays includes a transcription die onto which a circuit layout is transcribed to thereby form a circuit pattern, and a test die on which the test structure 900 is positioned. The test structure 900 is formed on the test die simultaneously with the circuit pattern, and the inspection process for inspecting the allowable process margin is performed only on the test structure 900 using voltage contrast between the grounded conductive lines 120 and the floating conductive lines 140.

The grounded conductive lines 120 and the floating conductive lines 140 may include conductive lines for a semiconductor device that are positioned at different layers. For example, the grounded conductive lines 120 may include a contact plug that is electrically connected to the substrate 800 to thereby be grounded to the substrate 800, and the floating conductive lines 140 may include a metal wiring that is electrically insulated from the contact plug by an insulation interlayer.

In some embodiments, each of the grounded and floating conductive lines 120 and 140 may have a width sufficiently large for reducing the likelihood of opening defects, and the grounded conductive lines 120 and the floating conductive lines 140 are arranged alternately with each other on the substrate in a first direction. Furthermore, the grounded conductive lines 120 and the floating conductive lines 140 are sufficiently spaced apart from each other by a first distance D1 for reducing the likelihood of electrical shorts, and thus it may be possible that no random defects may be positioned between the grounded conductive lines 120 and the floating conductive lines 140.

The grounded conductive lines 120 and the floating conductive lines 140 are arranged on the substrate alternately with each other in the first direction and are spaced apart by the first distance D1 sufficient for reducing the likelihood of electrical shorts, and thus a short-reduction area S is provided between the grounded conductive lines 120 and the floating conductive lines 140.

A pair of the neighboring grounded and floating conductive lines make up an inspection unit 130 for inspecting processing defects, and thus a plurality of the inspection units 130 are arranged on the substrate 800 in the first direction. Accordingly, the inspection units 130 are spaced apart by the first distance D1 in the first direction, and the short-reduction area S is positioned between the neighboring inspection units 130. The processing defects in the supplementary patterns are detected at every one of the inspection units 130 using a voltage contrast between the grounded conductive lines 120 and the floating conductive lines 140.

In some embodiments, the inspection units 130 are classified into a specimen unit 132 including the supplementary patterns in the short-reduction area S and a reference unit 134 including no supplementary patterns in the short-reduction area S, so that a plurality of the specimen units 132 and a plurality of the reference units 134 are arranged on the substrate 800.

The specimen units 132 has various supplementary patterns, which are described in detail hereinafter, in the short-reduction area S between the grounded conductive lines 120 and the floating conductive lines 140, and the sizes of the supplementary patterns are different from one another in each of the specimen units 132. Therefore, the processing defects of the specimen units 132 are determined by whether or not the supplementary patterns in the short-reduction area S includes any defects. In some embodiments, the grounded and the floating conductive lines 120 and 140 in each of the specimen units 132 may not include any random defects such as electrical shorts or openings, and thus the processing defects in the specimen units 132 may be caused by defects of the supplementary patterns 200 in the short-reduction area S.

In contrast, the reference units 134 may not include any supplementary patterns in the short-reduction area S between the grounded and floating conductive lines 120 and 140. Since the grounded and the floating conductive lines 120 and 140 in the reference units 134 may not include any random defects, no processing defects are detected in the reference units 134. Accordingly, a comparison of an electrical signal detected in the specimen units 132 (hereinafter referred to as specimen signal) with an electrical signal detected in the reference units 134 (hereinafter referred to as reference signal) may provide information on whether or not the specimen units 132 include any processing defects. That is, the reference signal provides criteria for decision on whether the specimen signal is normal or abnormal.

In some embodiments, the supplementary patterns 200 are arranged on the substrate 800 in such a manner that the specimen units 132 and the reference units 134 are positioned alternately with one another, and thus the specimen signals and the reference signals are also displayed alternately with one another, to thereby facilitate visual comparison of the specimen signal and the reference signal. Furthermore, the specimen units 132 and the reference units 134 are also spaced apart from each other by a first distance D1 and the short-reduction area S is between the specimen units 132 and the reference units 134, so that the random defects between the specimen units 132 and the reference units 134 also have no effect on the specimen signal and the reference signal.

In some embodiments, the supplementary patterns may include at least a first supplementary conductive line 210 extending from the first grounded conductive lines 120 to the floating conductive lines 140 and having a length smaller than the first distance D1 and at least a second supplementary conductive line 220 extending from the first floating conductive lines 140 to the grounded conductive lines 120 and also having a length smaller than the first distance D1. The first and second supplementary conductive lines 210 and 220 may be positioned at vertically different locations, and an insulation interlayer (not shown) may be between the first and second supplementary conductive lines 210 and 220. For example, the first supplementary conductive line 210 includes a conductive line extending from a contact plug, and the second supplementary conductive line 220 includes a conductive line extending downward from a metal wiring.

In some embodiments, the supplementary patterns 200 in each inspection unit 132 may have different sizes by controlling the processing parameters of a unit process for manufacturing a semiconductor device. Which of the processing parameters is controlled is determined by characteristics of the unit process of which the allowable process margin is to be inspected using the test structure 900.

For example, when the allowable process margin for electrical shorts between neighboring wirings is inspected in an arbitrary unit process, a plurality of the supplementary patterns 200 is arranged in every one of the specimen units 132 in such a manner that the gap distances between the first and the second conductive lines are different from one another in every one of the specimen units 132. Each of the specimen units 132 in which the processing defects are detected is selected as a defective unit, and the gap distances of the supplementary patterns 200 in the defective units are analyzed and compared with one another, to thereby determine the allowable process margin for the electrical short based on the analyzed results of the gap distance of the supplementary patterns 200.

Figure 3:
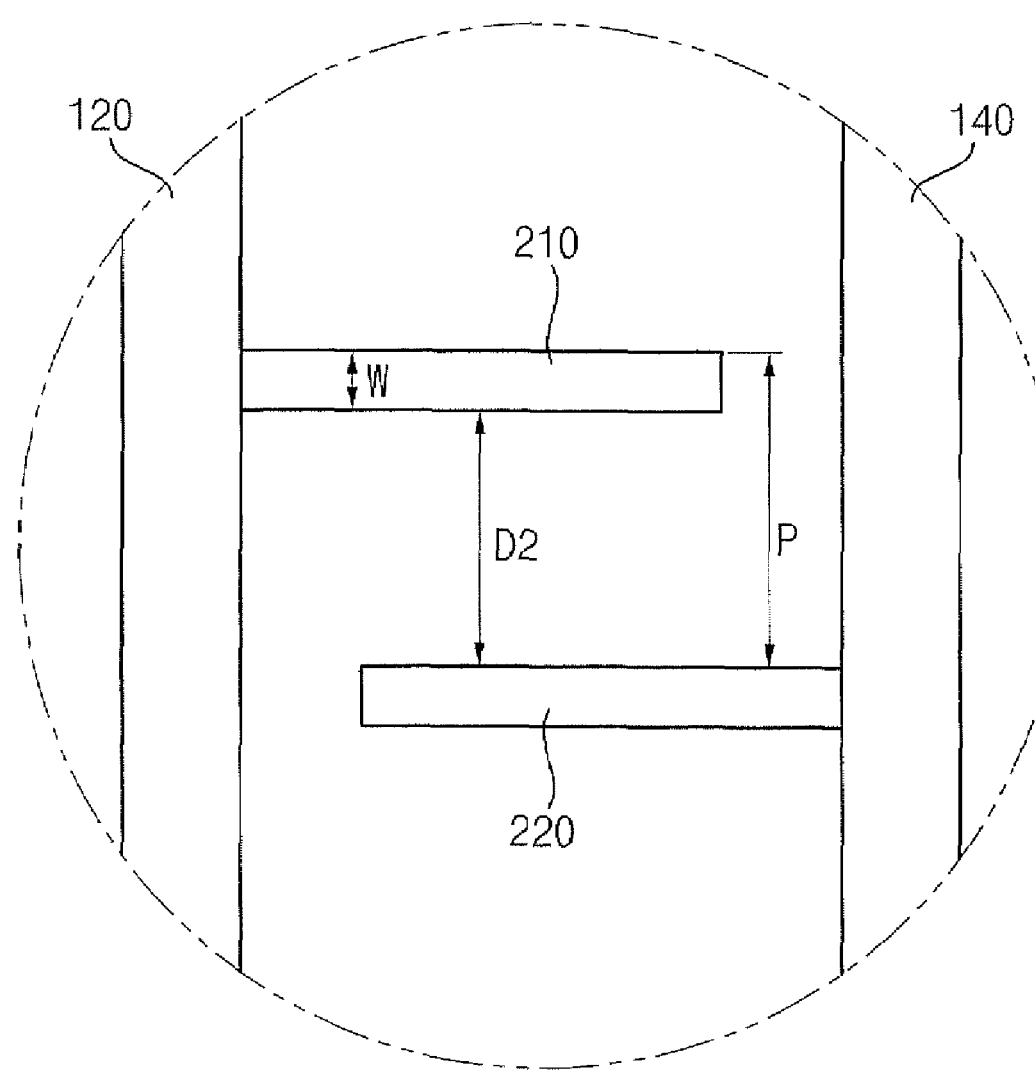
FIG. 3 is a partially enlarged view of a portion A of FIG. 2 in accordance with some embodiments of the present invention.

FIG. 3 is a partially enlarged view of a portion A of FIG. 2, and illustrates the supplementary patterns 200 in the specimen units 132. As illustrated in FIG. 3, the first and second supplementary conductive lines 210 and 220 are spaced apart from each other by a second distance D2. For example, electrical shorts between the first and the second conductive lines 210 and 220 may be decisively influenced by the second distance D2. For that reason, the test structure 900 is manufactured to have such a configuration that the second distance D2 of the supplementary patterns 200 is varied in accordance with the inspection unit 132. In some embodiments, when the first and the second supplementary conductive lines 210 and 220 may have a sufficient width for reducing the likelihood of opening defects, the processing defects in the specimen units 132 may only be influenced by the electrical shorts between the first and the second supplementary conductive lines 210 and 220.

Accordingly, when a plurality of the processing defects is detected in many specimen units of which the supplementary patterns 200 have different second distances D2, the various second distances D2 of the defective units are compared with one another and a minimum value of the second distances D2 of the supplementary patterns 200 is determined as the allowable process margin for the defects caused by the electrical short.

In contrast, when the first and the second supplementary conductive lines 210 and 220 has an insufficient width for reducing the likelihood of opening defects, the processing defects of the specimen units may be caused by both opening defects and electrical shorts, the width W of the first and second conductive lines 210 and 220 as well as the second distance D2 may also have an effect on the allowable process margin for the defects as follows.

For example, the sum of the width W of the first or the second supplementary conductive line 210 and 220 and the second distance D2 between the first and the second supplementary conductive lines 210 and 220 is defined as a pitch P of the supplementary patterns 200, and a plurality of the supplementary patterns 200 is arranged in each of the specimen units 132 in such a manner that the width W and the second distance D2 are different at every one of the specimen units 132 under the condition that the pitch P of the supplementary patterns 200 is maintained constant. When the second distance D2 is sufficiently large and the width W is sufficiently small, the processing defects may be caused by the opening of the supplementary conductive lines 210 and 220. In contrast, when the second distance D2 is sufficiently small and the width W is sufficiently large, the processing defects may be caused by the electrical short between the supplementary conductive lines 210 and 220. The widths W and the second distances D2 of the supplementary patterns 200 at each of the defective units are compared with one another, and a minimum combination of the width W and the second distance D2 is selected as the allowable processing margin.

Figure 4:
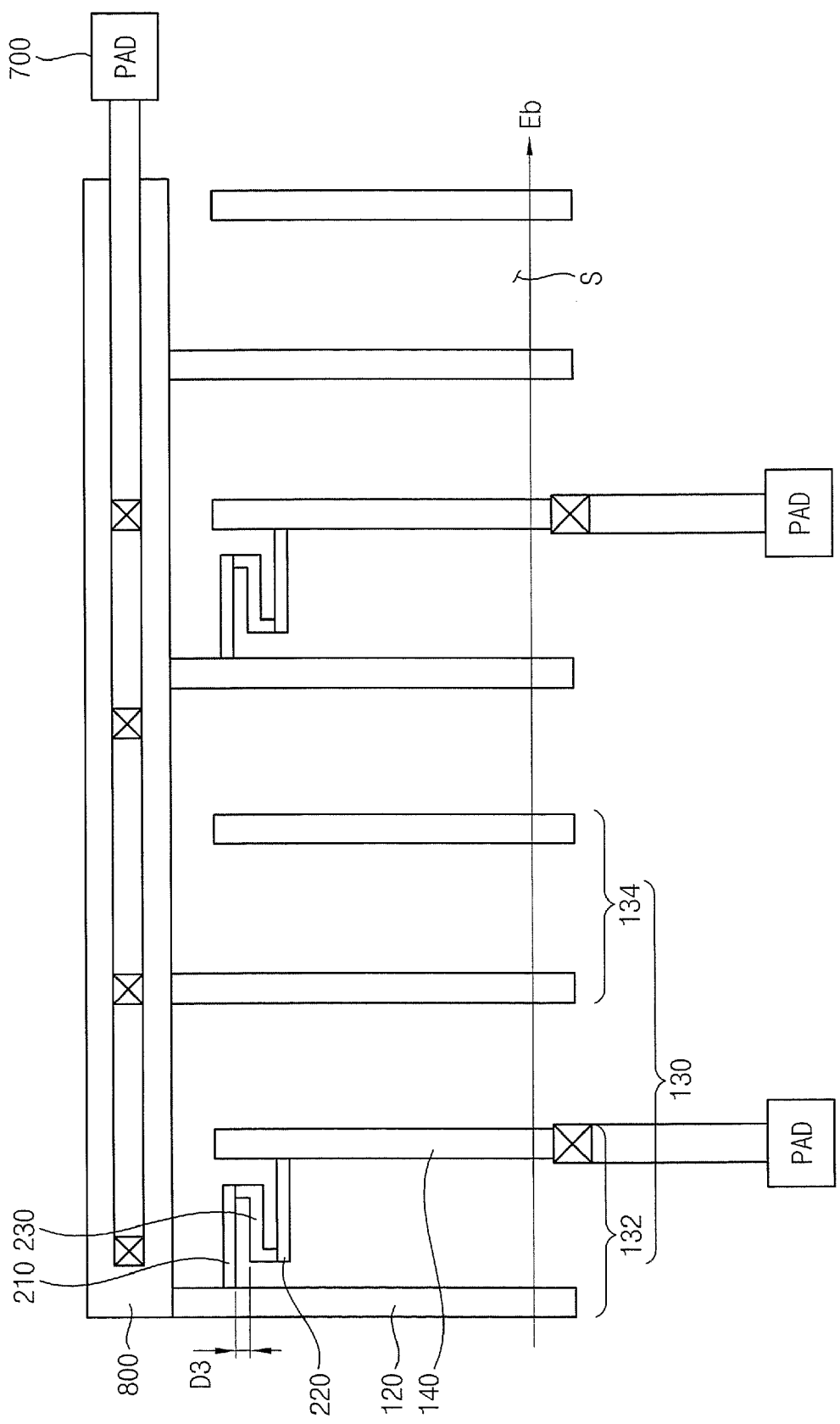
FIG. 4 is a plan view illustrating a test structure for checking an allowable error range or a process margin of a manufacturing process for a semiconductor device by voltage contrast inspection process in accordance with some embodiments of the present invention.

In some embodiments, the supplementary patterns 200 may further include a third supplementary conductive line 230 between the first and second supplementary conductive line 210 and 220, as shown in FIG. 4.

FIG. 4 is a plan view illustrating a test structure for checking an allowable error range or a process margin of a manufacturing process for a semiconductor device by voltage contrast inspection process in accordance with some embodiments of the present invention. As illustrated in FIG. 4, the supplementary patterns 200 may further include the third supplementary conductive line 230 that is positioned between the first and second supplementary conductive lines 210 and 220 and is parallel with both the first and second supplementary conductive lines 210 and 220. A first end portion of the third supplementary conductive line 230 is connected to an end portion of the first supplementary conductive line 210. A second end portion of the third supplementary conductive line 230, which is opposite to the first end portion of the third supplementary conductive line 230, is connected to an end portion of the second supplementary conductive line 220. For example, the third supplementary conductive line 230 is spaced apart from the first and second supplementary conductive lines 210 and 220 by a third distance D3, respectively in such a manner that electrical shorts may be sufficiently prevented between the first and third supplementary conductive lines 210 and 230 and between the second and third supplementary conductive lines 220 and 230. That is, the third supplementary conductive line 230 is sufficiently spaced apart from the first and second supplementary conductive lines 210 and 220, so that the processing defects detected in the specimen unit including the third supplementary conductive line 230 are only caused by the openings between the first, second and third supplementary conductive lines 210, 220 and 230.

A plurality of the supplementary patterns 200 including the third supplementary conductive line 230 is arranged in each of the specimen units 132 in such a manner that the third distance D3 of the supplementary patterns 200 is different from one another in each of the specimen units 132. When a plurality of the processing defects is detected in many specimen units 132 of which the supplementary patterns 200 have different third distances D3, the various third distances D3 of the defective units are compared with one another and a minimum value of the third distances D3 of the supplementary patterns 200 is determined as the allowable process margin for the defects caused by the electrical shorts.

In some embodiments, the test structure 900 may further include a measuring member 700 electrically connected to the grounded conductive lines 120 and the floating conductive lines 140 of each of the specimen units 132. The measuring member 700 measures a direct current passing through the grounded conductive lines 120 and the floating conductive lines 140. For example, the measuring member 700 may include a pad having an ampere meter that is configured to detect a microcurrent. Accordingly, the test structure 900 may detect the processing defects from the specimen units 132, and further may confirm the size of the detected processing defects by measuring the intensity of the current passing through the grounded conductive lines 120 and the floating conductive lines 140 of each of the specimen units 132.

The supplementary patterns 200 may further include a conductive connector, such as a contact plug and a fourth supplementary conductive line, such as a metal wiring that is connected to the conductive connector.

Figure 5:
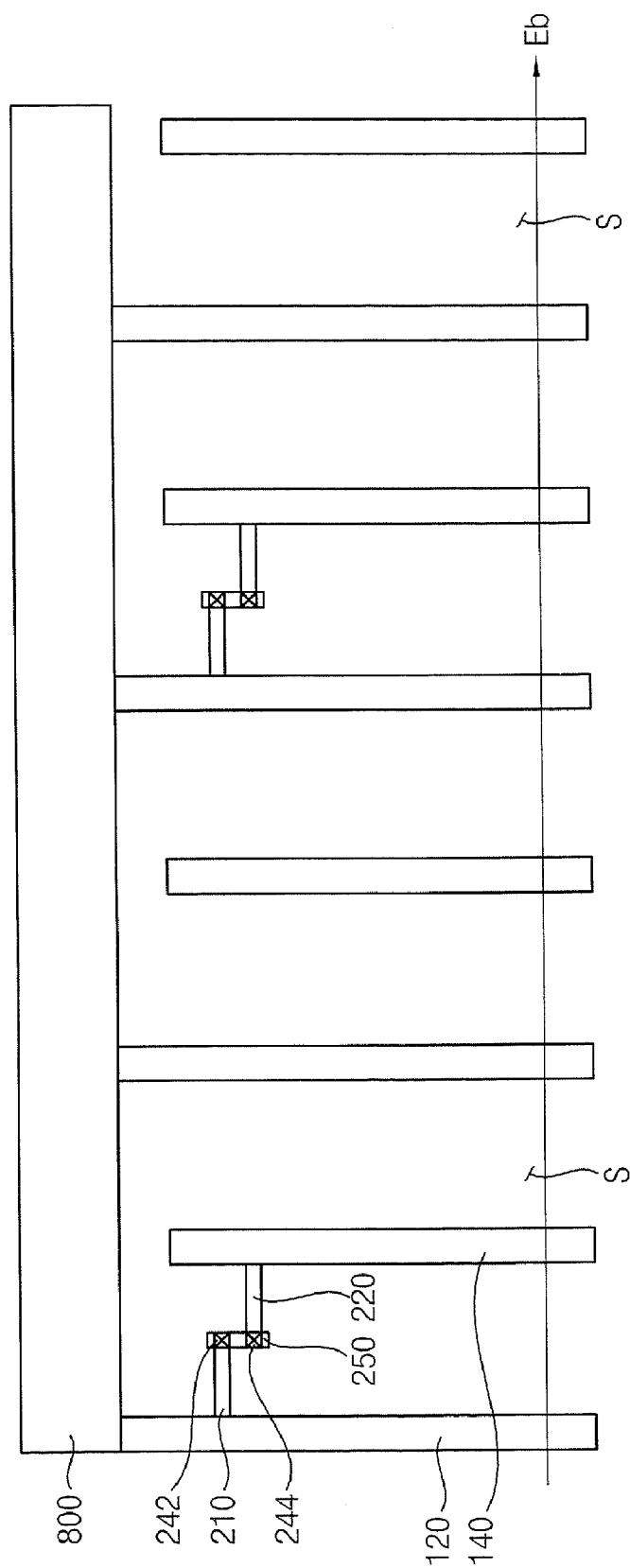
FIG. 5 is a plan view illustrating a test structure for checking an allowable error range or a process margin of a manufacturing process for a semiconductor device by voltage contrast inspection process in accordance with some embodiments of the present invention.
Figure 6A:
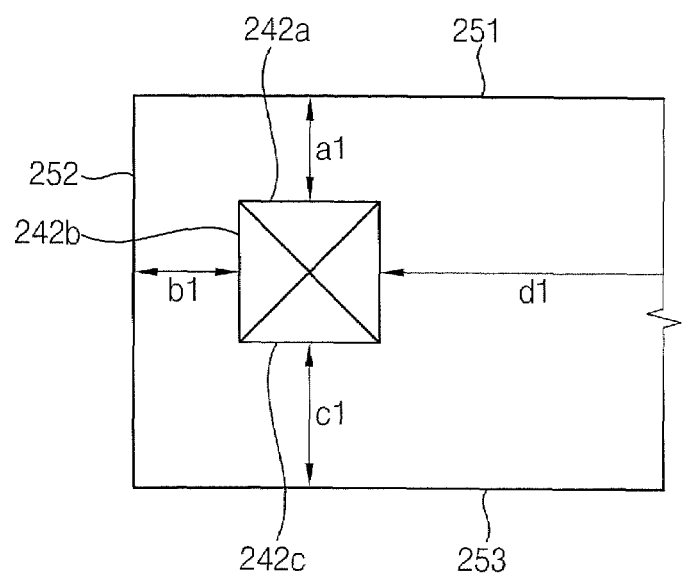
FIGS. 6A and 6B are views illustrating the process margin between the conductive connector and the fourth supplementary conductive line in accordance with some embodiments of the present invention.
Figure 6B:
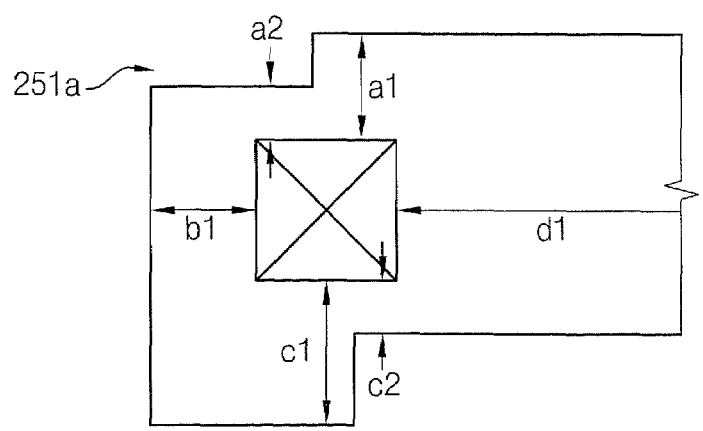

FIG. 5 is a plan view illustrating a test structure for checking an allowable error range or a process margin of a manufacturing process for a semiconductor device by voltage contrast inspection process in accordance with some embodiments of the present invention. FIGS. 6A and 6B are views illustrating the process margin between the conductive connector and the fourth supplementary conductive line.

Referring to FIG. 5, each of the supplementary patterns 200 includes a first conductive connector 242 electrically connected to the first supplementary conductive line 210, a second conductive connector 244 electrically connected to the second supplementary conductive line 220 and a fourth supplementary conductive line 250 electrically connected to the first and second conductive connectors 242 and 244. As shown in FIGS. 6A and 6B, a gap distance between a boundary portion of the first or the second conductive connectors 242 and 244 and a boundary portion of the fourth supplementary conductive line 250 may be varied in accordance with respective process conditions.

Referring to FIG. 6A, the boundary portions of the fourth supplementary conductive line 250 may be spaced apart from the boundary portions of the first and second conductive connectors 242 and 244 by first, second and third gap distances a1, b1 and c1, respectively, and the first and second conductive connectors 242 and 244 are spaced apart from each other by a fourth gap distance d1. In some embodiments, a first boundary portion 251 of the fourth supplementary conductive line 250 is spaced apart from a first edge portion 242a of the first conductive connector 242 by a first gap distance a1, and a second boundary portion 252 of the fourth supplementary conductive line 250 is spaced apart from a second edge portion 242b of the first conductive connector 242 by a second gap distance b1. A third boundary portion 253 of the fourth supplementary conductive line 250 is spaced apart from a third edge portion 242c of the first conductive connector 242 by a third gap distance c1.

In some embodiments, a plurality of the supplementary patterns 200 is arranged in each of the specimen units 132 of the test structure 900 in such a manner that the second, third and fourth gap distances b1, c1 and d1 are maintained constant and the first gap distance a1 is varied in accordance with the specimen units 132. Each of the specimen units 132 may detect electrical contact defects between the conductive connector and the fourth supplementary conductive line, and the electrical contact defects are mainly caused by the first gap distance a1. The specimen units 132 from which the electrical contact defects are detected are selected as the defective units and the first gap distance a1 is detected in each of the defective units. A minimum value of the first gap distance a1 indicates a minimum gap distance between the first conductive connector 242 and the fourth supplementary conductive line 250 for causing the electrical contact defects. Therefore, the minimum value of the first gap distance a1 is selected as the allowable process margin of the electrical contact defects. In the same way, a plurality of the supplementary patterns 200 is arranged in each of the specimen units 132 of the test structure 900 in such a manner that one of the second, third and fourth gap distance b1, c1 and d1 is varied in accordance with the specimen units 132 under the condition that the other gap distances are maintained constant. The selection of the defective units from the specimen units 132 and detection of a specific gap distance from the defective units may determine the allowable process margin with respect to each of the second, third and fourth gap distances b1, c1 and d1, respectively.

Referring to FIG. 6B, an exemplarily modification of the fourth supplementary conductive line 250 is disclosed. The first boundary portion 251 is partially removed from the fourth supplementary conductive line 250. Therefore, the first boundary portion 251 is partially spaced apart from the edge portion 242a by the first gap distance a1 and is partially spaced apart from the edge portion 242a by a first depression distance a2. Accordingly, there is an advantage in that various allowable process margins may be determined using a pair of side portions of the fourth supplementary conductive line 250 and the first conductive connector 242 that are parallel with each other. For example, when a metal wiring is positioned much more adjacent to a first depression portion 251a of the first boundary portion 251 than any other portion thereof, the first depression distance a2 may have a higher effect on the processing defects than the first gap distance a1. In such a case, a first allowable process margin to the first gap distance a1 may be determined at first, and then a second allowable process margin to the first depression distance a2 may be much more accurately determined in view of shapes of the metal wirings adjacent to the fourth supplementary conductive line 250.

While some embodiments of the present invention discloses a third depression distance c2 as well as the first depression distance a2, additional depression distances may be formed at various positions with various sizes in accordance with the shapes and sizes of the neighboring meta wirings adjacent to the fourth supplementary conductive line 250.

In some embodiments, the first and second conductive connectors 242 and 244 may include a contact plug that is electrically connected with the first and second supplementary conductive lines 210 and 220. The fourth supplementary conductive line 250 may be a metal wiring that is electrically connected to the contact plug.

Figure 7:
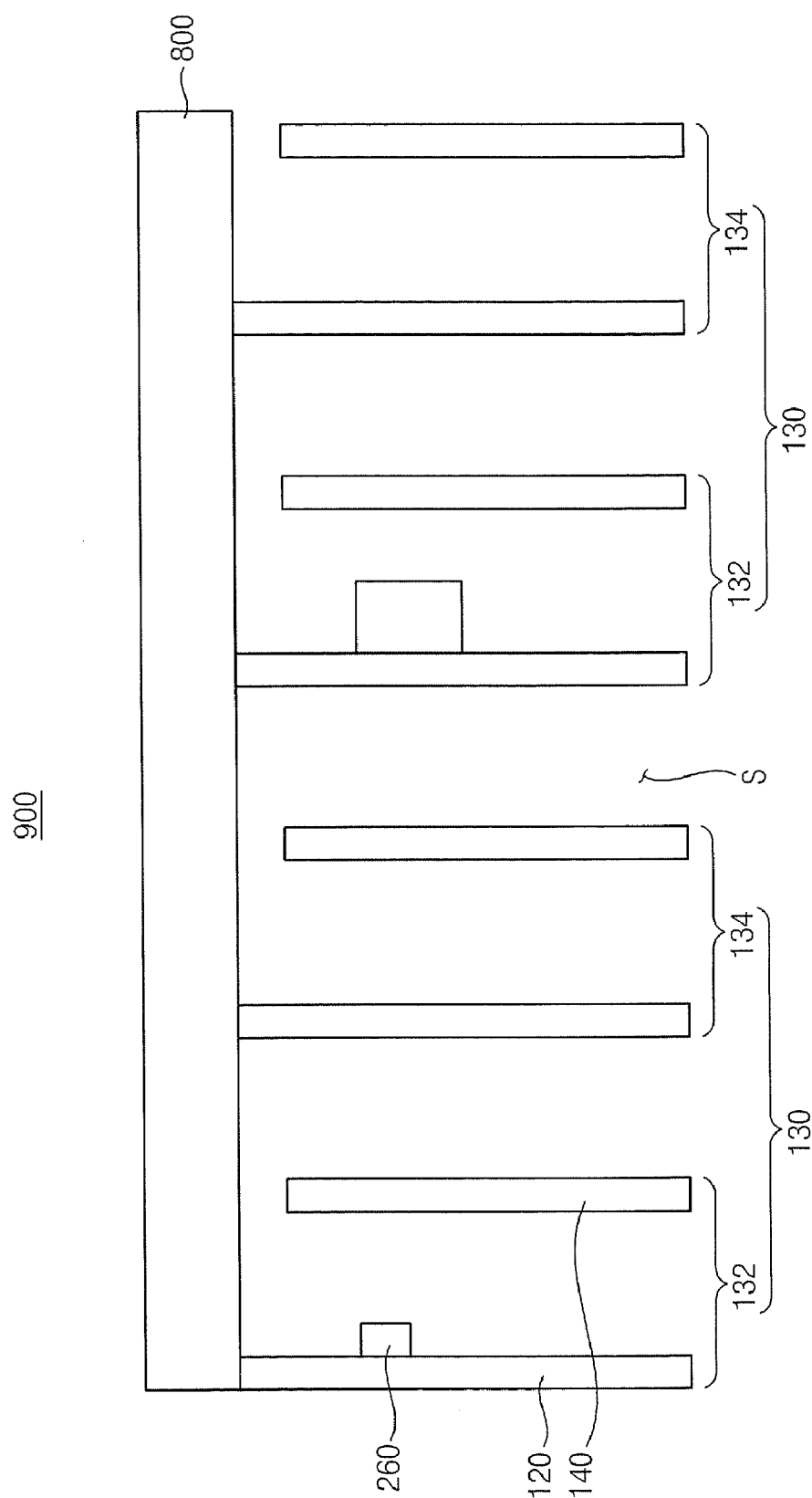
FIG. 7 is a plan view illustrating a test structure for checking an allowable error range or a process margin of a manufacturing process for a semiconductor device by voltage contrast inspection process in accordance with some embodiments of the present invention.

Each of the supplementary patterns 200 may further include a protrusion for identifying sizes of particles and voids. FIG. 7 is a plan view illustrating a test structure for checking an allowable error range or a process margin of a manufacturing process for a semiconductor device by voltage contrast inspection process in accordance with some embodiments of the present invention.

As illustrated in FIG. 7, each of the supplementary patterns 200 may include a protrusion 260 that is protruded from the grounded conductive lines 120 or from the floating conductive lines 140 in the short-reduction area S. The size of the protrusion 260 may be varied in accordance with the specimen units 132. The protrusion 260 may work as a particle in a manufacturing process for a semiconductor device or may have no effect on the manufacturing process in accordance with the size of the protrusion 260. Every protrusion 260 is selected from the specimen units 132 from which processing defects are detected, and the sizes of all of the selected protrusions are measured and analyzed by a proper analysis tool. A minimum value among the measured sizes of the protrusions 260 is determined as an allowable processing error for the above processing defects caused by the protrusion 260.

Figure 8:
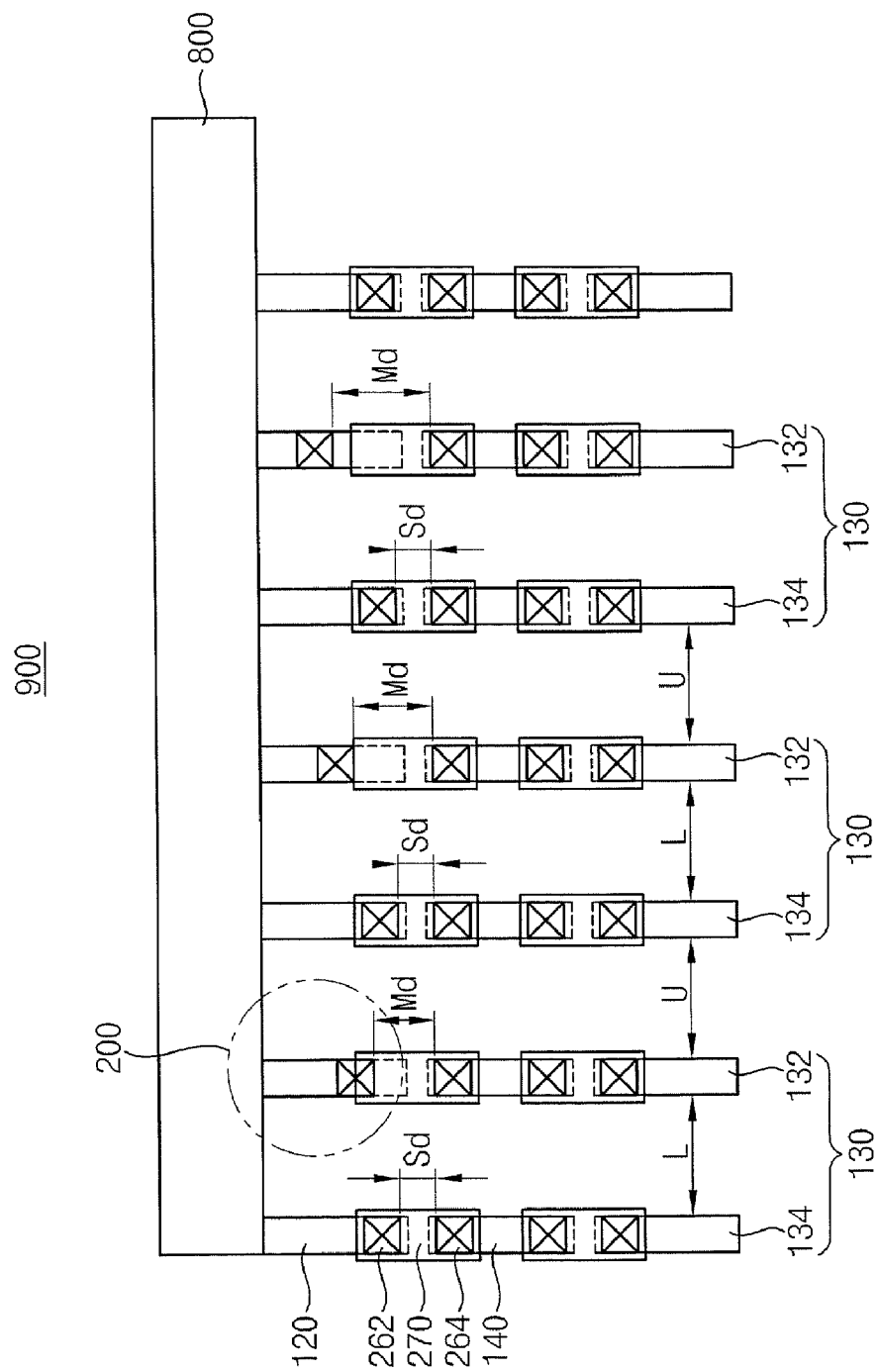
FIG. 8 is a plan view illustrating a test structure for checking an allowable error range or a process margin of a manufacturing process for a semiconductor device by voltage contrast inspection process in accordance with some embodiments of the present invention.

The supplementary patterns 200 may still further include a conductive structure for identifying an overlap margin between a contact plug and a metal wiring. FIG. 8 is a plan view illustrating a test structure for checking an allowable error range or a process margin of a manufacturing process for a semiconductor device by voltage contrast inspection process in accordance with some embodiments of the present invention.

Referring to FIG. 8, the supplementary patterns 200 may include a first conductive plug 262 electrically connected to the grounded conductive lines 120, a second conductive plug 264 spaced apart from the first conductive plug 262 and electrically connected to the floating conductive lines 140, and an additional conductive line 270 electrically connected to the first and second conductive plugs 262 and 264.

In some embodiments, the grounded conductive lines 120 and the floating conductive lines 140 are electrically connected through the additional conductive line 270, to thereby form a single conductive wiring in the inspection units 130. Accordingly, the above inspection units 130 including the single conductive wiring may inspect a process margin or an overlap margin between a metal wiring and a plug or a via that are frequently formed in a manufacturing process for a semiconductor device. For example, the test structure 900 of some embodiments includes a plurality of the inspection units 130 including the grounded conductive lines and the floating conductive lines that are interconnected by the supplementary conductive line through the contact plug or the via, and the inspection units 130 are spaced apart from one another by a predetermined unit gap U.

In some embodiments, each of the inspection units 130 includes a reference unit 134 and a specimen unit 132. The first and second conductive plugs 262 and 264 are spaced apart from each other by a standard gap distance Sd in the reference unit 134, and the reference unit 134 generates a standard signal as a reference signal for determining whether or not defects have occurred. In contrast, the first and second conductive plugs 262 and 264 are spaced apart from each other by a measuring gap distance Md in the specimen unit 132, and the specimen unit 132 generates a specimen signal that is to be compared with the reference signal to thereby inspect the allowable error range or the process margin. The specimen unit 132 and the reference unit 134 may be spaced apart from each other by a line gap L. In some embodiments, the line gap L is the same as the unit gap U, and the reference unit 134 and the specimen unit 132 are arranged alternately with each other. A reference image is generated from the reference signal and a measuring image is generated from the specimen signal.

Therefore, the reference image and the measuring image are also displayed alternately with each other, to thereby facilitate the determination on whether or not the specimen unit 132 is defective just by a comparison of the neighboring reference and measuring images.

In some embodiments, each measuring gap distance Md in each of a plurality of specimen units 132 is set to be different from one another on condition that the size of each additional conductive line 270 is constant in each of the inspection units 130. When the measuring gap distance Md between the first and second conductive plugs 262 and 264 is greater than an allowable error limit, the first and second conductive plugs 262 and 264 are electrically separated from each other, and thus the grounded conductive lines 120 and the floating conductive lines 140 are also electrically separated from each other. The electrical separation of the grounded conductive lines 120 and the floating conductive lines 140 may cause electrical defects in a via chain including the first and second conductive plugs 262 and 264. As a result, the specimen units 132 may be determined to be a defective unit in the above inspection process.

All of the measuring gap distances Md are detected in the defective specimen units 132 and the process margin between the additional conductive line 270 and the conductive plugs 262 and 264 is inspected in each of the inspection units 130 based on the respective measuring gap distance Md. In some embodiments, a maximum measuring gap distance Md that does not cause electrical defects in the via chain is selected as an allowable error range or the allowable process margin.

In some embodiments, the grounded and floating conductive lines 120 and 140 may include a portion of a conductive structure for a semiconductor device, and the number of the supplementary patterns 200 including the additional conductive line 270 and the conductive plugs 262 and 264 may range from about $10/\mu m^2$ to about $20/\mu m^2$. A single scan of an electron beam onto the test structure may provide an allowable error range or an allowable process margin of each unit process for manufacturing a semiconductor device.

Accordingly, the test structure 900 for a voltage contrast inspection process may include various supplementary patterns having different sizes between the grounded and floating conductive lines. A single scan of the electron beam may sufficiently measure the sizes of defective supplementary patterns, each of which is positioned in a defective specimen unit including an electrical defect. The allowable error range or the allowable process margin may be determined by a comparison of the sizes of defective supplementary patterns.

Figure 9:
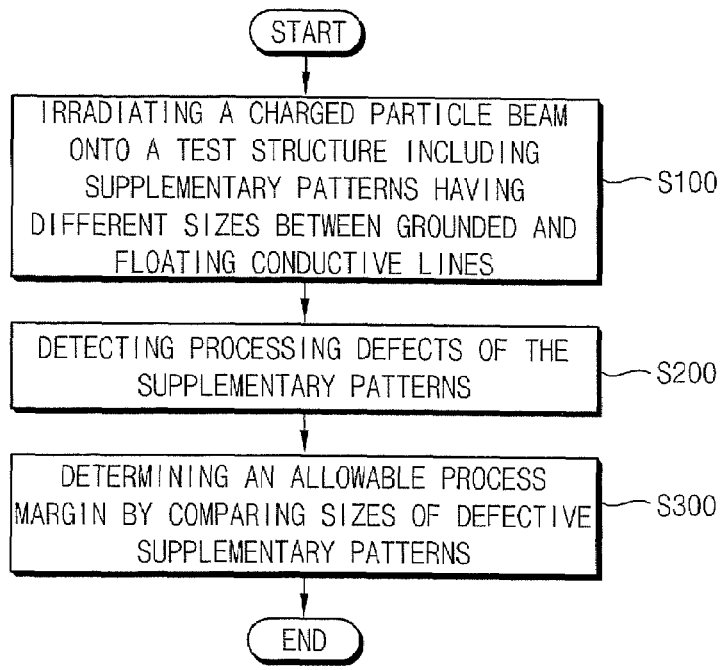
FIG. 9 is a flowchart illustrating methods of inspecting an allowable error range using a voltage contrast test structure in accordance with some embodiments of the present invention.

FIG. 9 is a flowchart illustrating a method of inspecting an allowable error range using a voltage contrast test structure in accordance with some embodiments of the present invention. As illustrated in FIGS. 2 and 9, a charged particle beam or an electron beam is irradiated onto the test structure 900 including a plurality of grounded conductive lines 120, a plurality of floating conductive lines 140 spaced apart from the grounded conductive lines 120 and electrically isolated from surroundings and a plurality of supplementary patterns 200 connected to the grounded and floating conductive lines 120 and 140, respectively (step S100).

The test structure 900 including the supplementary patterns 200 has substantially the same structure as described with reference to FIGS. 2 to 8, and thus any detailed descriptions on the test structure 900 is omitted hereinafter. However, the shapes and configurations of the supplementary patterns 200 may be varied in accordance with defects that are frequently generated in each unit process for a semiconductor device, as would be known to one of ordinary skill in the art. In some embodiments, the charged particle beam may include an electron beam and is irradiated onto the substrate of the test structure 900 along a first direction Eb across end portions of the grounded and floating conductive lines 120 and 140.

Then, electrical signals are generated from each end portions of the grounded and floating conductive lines 120 and 140, respectively, and are detected by a detection tool. The processing defects of each of the supplementary patterns 200 are inspected based on the detected signals (step S200).

Figure 10:
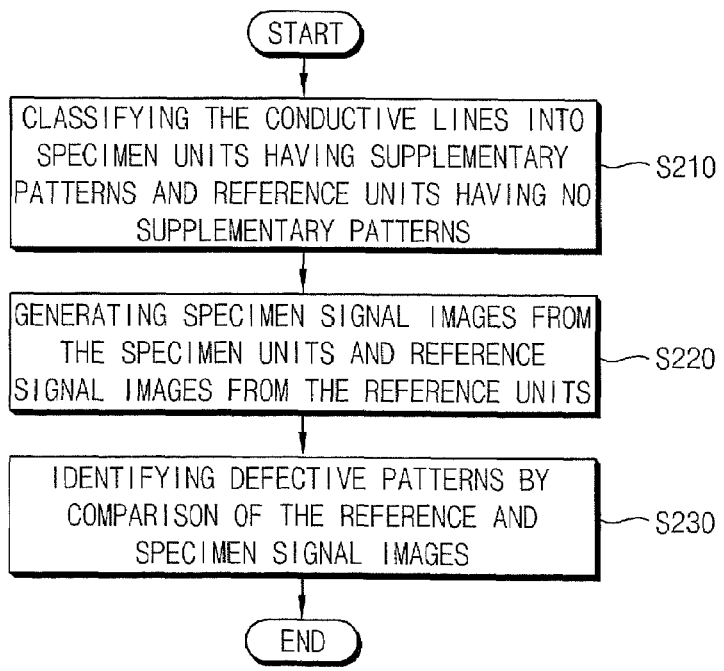
FIG. 10 is a flowchart illustrating inspecting processing defects as shown in FIG. 9 in accordance with some embodiments of the present invention.

FIG. 10 is a flowchart illustrating methods for inspecting the processing defects as shown in FIG. 9 in accordance with some embodiments of the present invention. As illustrated in FIG. 10, a plurality of the grounded and floating conductive lines is grouped into inspection units 130, each of which includes one of the grounded conductive lines 120 and one of the floating conductive lines 140. The inspection units 130 are classified into the specimen units 132 and the reference units 134. Each of the specimen units 132 includes the supplementary patterns in the short-reduction area S between the grounded and floating conductive lines 120 and 140, and each of the reference units 134 includes no supplementary patterns in the short-reduction area S between the grounded and floating conductive lines 120 and 140 (step S210). A specimen signal image is generated based on the electrical signal generated from the specimen units 132, and a reference signal image is generated based on the electrical signal generated from the reference units 134 (step S220). Particularly, the specimen signal image and the reference signal image are generated by a voltage contrast of the grounded conductive lines 120 and the floating conductive lines 140, respectively. In some embodiments, secondary electrons are generated from the end portions of the grounded and floating conductive lines 120 and 140 by the electron beam, and the voltage caused by the secondary electrons are used to generate the signal image of the specimen units 132 and reference units 134. While some embodiments discloses the image signals are generated using the secondary electrons from the grounded and floating conductive lines 120 and 140, back-scattered electrons or any other voltage sources known to one of ordinary skill in the art may also be utilized in place of or in conjunction with the secondary electrons. The signal images may also be shown on a display device, to thereby facilitate visibility of the signal images.

In some embodiments, the specimen units 132 and the reference units 134 are arranged in the test structure 900 alternately with each other, so that the specimen signal images and the reference signal images are also displayed alternately with each other in accordance with the specimen units 132 and the reference units 134.

Figure 11:
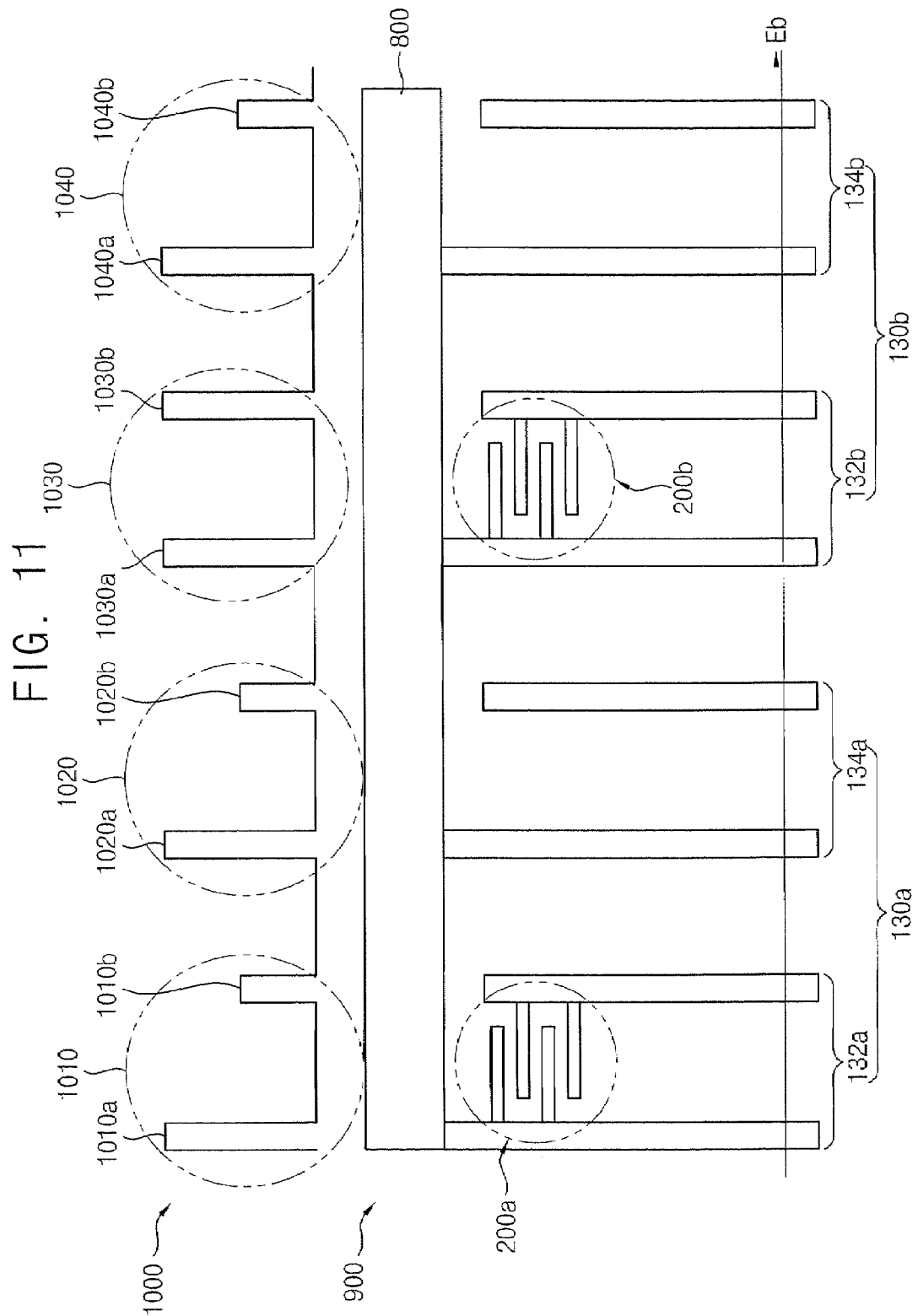
FIG. 11 is a view illustrating signal images generated from the test structure including the supplementary patterns in FIG. 2.

FIG. 11 is a view illustrating signal images generated from the test structure including the supplementary patterns in FIG. 2. The signal images in FIG. 11 are generated from the test structure 900 including some embodiments of the supplementary patterns shown in FIG. 2, and thus may have various shapes in accordance with the structures and shapes of the supplementary patterns and the specimen units, as would be known to one of ordinary skill in the art. As illustrated in FIG. 11, the test structure 900 includes a first inspection unit 130a and a second inspection unit 130b, and more particularly, includes a first specimen unit 132a and a first reference unit 134a and a second specimen unit 132b and a second reference unit 134b. Furthermore, a first supplementary pattern 200a in the first specimen unit 132a have no defects, and a second supplementary pattern 200b in the second specimen unit 132b have electrical short defects.

Referring to FIG. 11, signal images 1000 generated from the test structure 900 may include a first specimen signal image 1010, a first reference signal image 1020, a second specimen signal image 1030 and a second reference signal image 1040 generated from the first specimen unit 132a, the first reference unit 134a, the second specimen unit 132b and the second reference unit 134a, respectively. The secondary electrons generated from the grounded conductive lines 120 by the electron beam travel toward the substrate to thereby generate an electrical current having a relatively high voltage. In contrast, the secondary electrons generated from the floating conductive lines 140 by the electron beam are isolated into the inside of the floating conductive lines 140, to thereby generate an electrical current having a relatively low voltage. Accordingly, the first specimen signal image 1010 corresponding to the first specimen unit 132a having no defects includes a high voltage signal image 1010a generated from the grounded conductive lines 120 and a low voltage signal line 1010b generated from the floating conductive lines 140. The first reference signal image 1020 corresponding to the first reference unit 134a and adjacent to the first specimen signal image 1010 always includes a high voltage signal image 1020a generated from the grounded conductive lines 120 and a low voltage signal line 1020b generated from the floating conductive lines 140, because no supplementary patterns are positioned in the first reference unit 134a. Accordingly, the first specimen signal image 1010 has substantially the same shape as the first reference signal image.

In contrast, the second supplementary pattern 200b in the second specimen unit 132b includes electrical short defects, and thus the grounded conductive lines and the floating conductive lines in the second specimen unit 132b is electrically connected to each other through the second supplementary pattern 200b, so that electrical current passes through the grounded and floating conductive lines in the second specimen unit 132b. Accordingly, the signal image 1030b generated from the floating conductive lines in the second specimen unit 132b has a relatively high voltage, so that the second specimen signal image is different from the second reference signal image 1040 that is substantially the same as the first reference signal image 1020.

When the specimen signal image is compared with the reference signal image and is different from the reference signal image, the specimen unit corresponding to the specimen signal image is classified as a defective unit and the supplementary patterns in the defective specimen unit may be identified as defective patterns (step S230). The comparison between the specimen signal image and the reference signal image may include a binary subtraction between digital signal images. The specimen and reference signals are based on the secondary electrons generated from the end portions of the conductive lines 120 and 140, so that the specimen and reference signals are easily transformed into digital signals to thereby be easily formed into digital images. As a result, the comparison of the specimen and reference image signals may be performed by binary subtraction of the digital signals. The current passing through the grounded and the floating conductive lines 120 and 140 in the second specimen unit 132b, which is a defective unit, is measured by a measuring tool, so that the defects in the supplementary pattern 200b of the second specimen unit 132b may be quantitatively detected in numerical form.

The size of each of the defective patterns in the defective unit is measured to thereby determine the allowable error range or the allowable process margin for reducing the likelihood of processing defects in the defective unit (step S300). For example, the size of each of the defective patterns is stored in a storing unit (not shown), and a comparison process is performed between the stored sizes of each of the defective patterns. Then, a maximum or a minimum size of the defective patterns is determined as the allowable error rang or the allowable process margin for a specified process.

In some embodiments, the sizes of the defective patterns includes widths of the first and second supplementary conductive lines 210 and 220, the second distance D2 between the first and second supplementary conductive lines 210 and 220 and/or the third distance D3 between the third supplementary conductive line 230 and the first or second supplementary conductive line 210 or 220.

When the supplementary patterns 200 may include the first conductive connector 242 electrically connected to the first supplementary conductive line 210, the second conductive connector 244 electrically connected to the second supplementary conductive line 220 and a fourth supplementary conductive line 250 electrically connected to the first and second conductive connectors 242 and 244, as shown in FIG. 5, the sizes of the defective patterns may include an edge gap distance between the first conductive connector 242 and the fourth supplementary conductive line 250 and between the first conductive connector 242 and the fourth supplementary conductive line 250.

Figure 12:
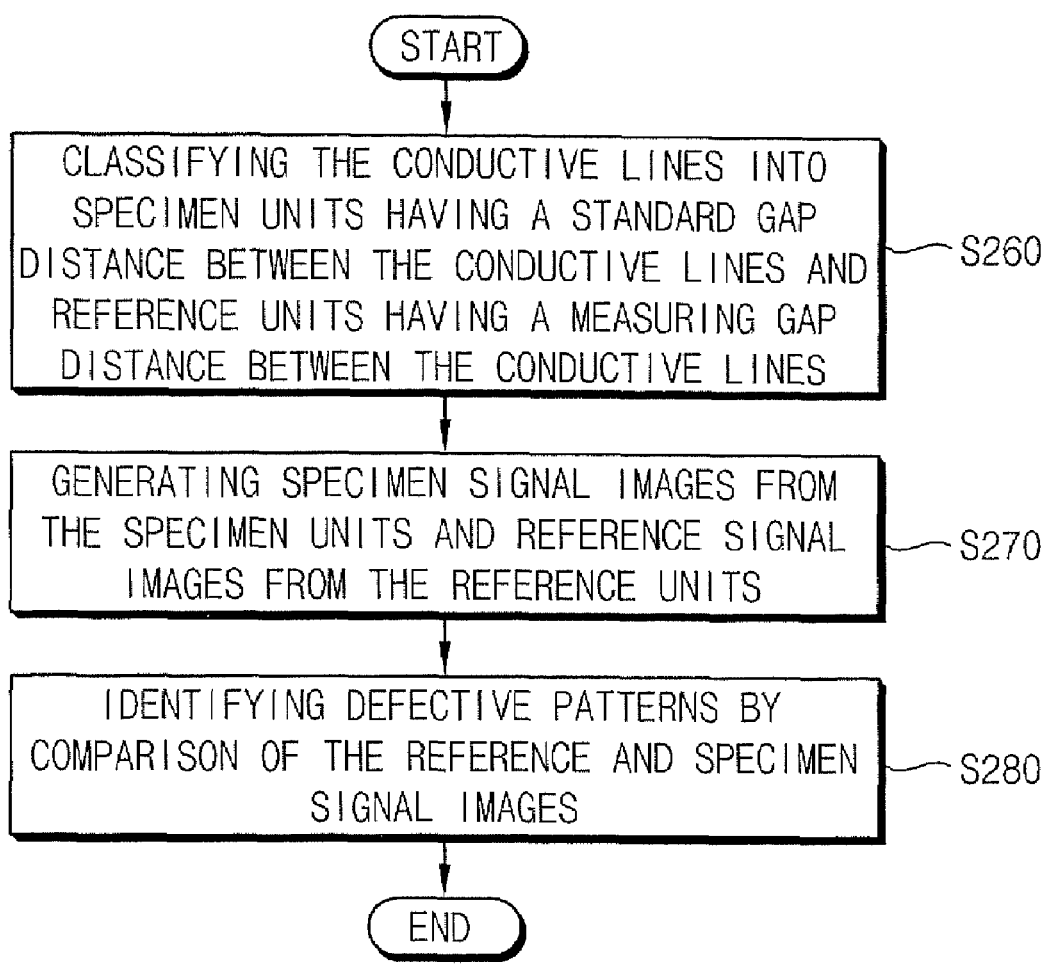
FIG. 12 is a flowchart illustrating methods for inspecting processing defects as shown in FIG. 9 in accordance with some embodiments of the present invention.

FIG. 12 is a flowchart illustrating methods for inspecting the processing defects as shown in FIG. 9 in accordance with some embodiments of the present invention. FIG. 12 exemplarily discloses a method of inspecting an alignment margin of a contact and a via chain for a semiconductor device.

Referring to FIGS. 8 and 12, a plurality of the grounded and floating conductive lines on the substrate 800 is grouped into inspection units 130, each of which includes one of the grounded conductive lines 120 and one of the floating conductive lines 140. In some embodiments, each of the inspection units 130 is classified as either a reference unit 134 or a specimen unit 132 (step S260). The first and second conductive plugs 262 and 264 are spaced apart from each other by a standard gap distance Sd in the reference unit 134, while spaced apart by a measuring gap distance Md in the specimen unit 132. The reference unit 134 generates a reference signal for determining whether or not a defect occurs and the specimen unit 132 generates a specimen signal that is to be compared with the reference signal to thereby inspect the allowable error range or the process margin (step S270).

Figure 13:
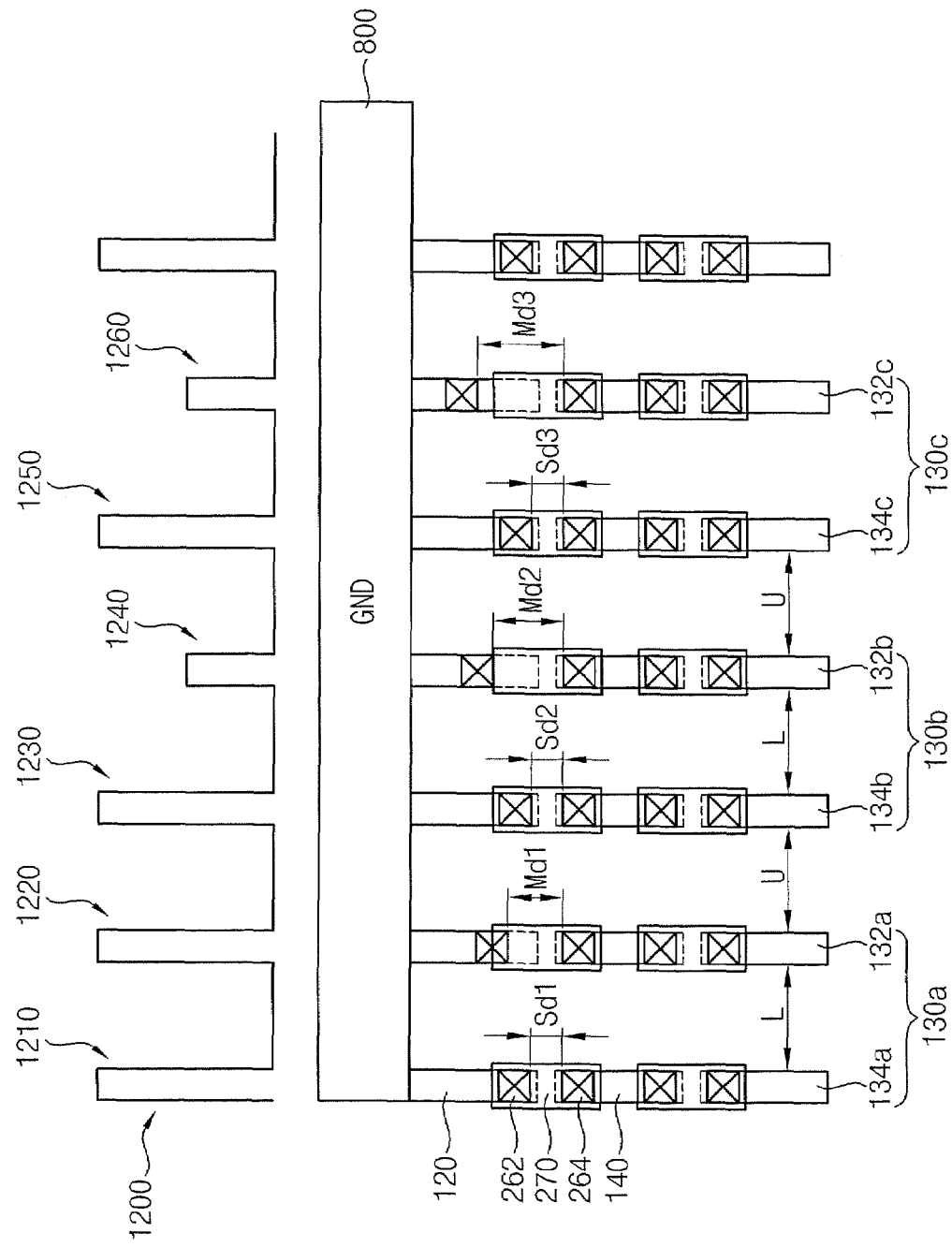
FIG. 13 is a view illustrating signal images generated from the test structure including the first and second conductive plugs in FIG. 8.

FIG. 13 is a view illustrating signal images generated from the test structure including the first and second conductive plugs in FIG. 8. For example, the test structure 900 generating the signal images in FIG. 13 included three specimen units 132 and three reference units 134, the first and second conductive plugs 262 and 264 were spaced apart from each other by first, second and third measuring gap distances Md1, Md2 and Md3, respectively in each of the specimen units. An electron beam was irradiated onto the test structure 900 and the secondary ions were generated from the test structure 900. The signal image in FIG. 13 was generated using a voltage contrast based on the secondary ions. The process for generating the signal image in FIG. 13 is substantially the same process as described in step 220 with reference to FIG. 10, and thus any further detailed descriptions on the process for generating the signal image is omitted hereinafter.

Here, since the additional conductive line 270 in the test structure 900 had a constant size, the electrical connection between the first conductive plug 262 and the additional conductive line 270 and between the second conductive plug 264 and the additional conductive line 270 was determined in accordance with the measuring gap distance Md. Accordingly, when the grounded conductive lines 120 was electrically connected with the floating conductive lines 140 through the first and second conductive plugs 262 and 264 and the additional conductive line 270 in a specimen unit 132, the signal image for the specific specimen unit was shown to have a relatively high voltage. In contrast, when the grounded conductive lines 120 were electrically broken from the floating conductive lines 140 in another specimen unit 132, the signal image for another specimen unit was shown to have a relatively low voltage. Therefore, the signal image 1200 in each of the inspection units 130 facilitated visual comparison of the signal voltage, to thereby easily determine which of the specimen units generates the processing defect. The signal image 1200 in FIG. 13 also includes first, second and third reference signal images 1210, 1230 and 1250 and first, second and third specimen signal images 1220, 1240 and 1260.

Referring to FIG. 13, the first specimen signal image 1220 is shown to have a relatively high voltage, while the second and third specimen signal images 1240 and 1260 are shown to have relatively low voltages, respectively. Therefore, the first and second conductive plugs and the supplementary conductive line are electrically connected with one another in the first specimen unit 132a, while the first and second conductive plugs and the supplementary conductive line are electrically broken from one another in the second and third specimen units 132b and 132c, respectively. As a result, the first measuring gap distance Md1 may be allowable in a process for forming a contact or a via chain, while the second and third measuring gap distances Md2 and Md3 may not be allowable.

The specimen signal image is compared with the reference signal image in each of the inspection units 130. When the specimen signal image is not coincident to the reference signal image in each of the inspection units 130, the specimen unit corresponding to the specimen signal image may be determined to be a defective unit and the supplementary patterns in the defective specimen unit may also be determined to be defective patterns (step S280). In some embodiments, the comparison between the signal images is performed by binary subtraction of the digital signals. The specimen and reference signals are based on the secondary electrons generated from the end portions of the conductive lines 120 and 140, to thereby facilitate the transformation of the specimen and reference signals into a digital signal. As a result, the specimen and reference signals may be easily formed into digital signal images, and the comparison of the specimen and reference image signals may be performed by binary subtraction of the digital signals.

The size of each of the defective patterns in the defective unit is measured to thereby determine the allowable error range or the allowable process margin for reducing the likelihood of the processing defects in the defective unit, as described in step S300. In some embodiments, the first measuring gap distance Md1, which is the maximum distance of the three measuring gap distances Md1, Md2 and Md3, is determined as the allowable error range or the allowable process margin. The accuracy of the allowable error range may become higher as the number of the supplementary patterns becomes larger.

As a result, a single irradiation of the electron beam may be sufficient for inspecting the size of each of the supplementary patterns arranged between the grounded and floating conductive lines in the defective unit. Therefore, no additional devices and processing time may be needed in an inspection process for a semiconductor device.

According to some embodiments of the present invention, various supplementary patterns having different sizes may be between grounded and floating conductive lines in a test structure so as to detect processing defects based on a voltage contrast method, and a single irradiation of an electron beam may sufficiently detect the sizes of the supplementary patterns between the grounded and floating conductive lines of each defective unit. The detected sizes of the supplementary patterns are compared with one another, and the maximum or the minimum value of the detected sizes of the supplementary patterns may be determined as an allowable error range or an allowable process margin of a unit process for manufacturing semiconductor devices.

Although the example embodiments of the present invention have been described, it is understood that the present invention should not be limited to these example embodiments but various changes and modifications can be made by one skilled in the art within the spirit and scope of the present invention as hereinafter claimed.

That which is claimed is:

1. A method of inspecting an allowable process margin in a manufacturing process for a semiconductor device, comprising:
   irradiating a charged particle beam onto a test structure including a plurality of grounded conductive lines, a plurality of floating conductive lines spaced apart and electrically separated from the grounded conductive lines, and a plurality of supplementary patterns electrically connected to the grounded and the floating conductive lines and having different sizes;
   inspecting processing defects of the supplementary patterns by detecting electrical signals generated from the grounded and the floating conductive lines due to the charged particle beam; and
   determining an allowable process margin based on sizes of the supplementary patterns from which the processing defects are inspected.

2. The method of claim 1, wherein the charged particle beam comprises an electron beam.

3. The method of claim 2, wherein inspecting the processing defects comprises:
   classifying the grounded and floating conductive lines into a plurality of inspection units, each of which comprises a pair of one of the grounded conductive lines and one of the floating conductive lines, a specimen unit having the supplementary patterns and a reference unit having no supplementary patterns;
   generating a reference signal image corresponding to reference signals generated from the grounded and the floating conductive lines of the reference unit and a specimen signal image corresponding to specimen signals generated from the grounded and the floating conductive lines of the specimen unit; and
   identifying the supplementary patterns in the specimen unit as defective patterns when the reference signal image and the specimen signal image are different in the inspection unit.

4. The method of claim 3, wherein generating the reference signal image and the specimen signal image comprises:
   detecting secondary electrons generated from the grounded conductive lines and the floating conductive lines by the electron beam;
   measuring voltages of the grounded and the floating conductive lines in each of the inspection units; and
   displaying each of the voltages as a visual image in accordance with the grounded and the floating conductive lines to generate the reference signal image indicating the voltages measured from the grounded and the floating conductive lines of the reference unit, and the specimen signal image indicating the voltages measured from the grounded and the floating conductive lines of the specimen unit.

5. The method of claim 4, wherein the specimen signal image and the reference signal image are displayed alternately with each other to facilitate voltage contrast analysis between the specimen signal image and the reference signal image adjacent to each other.

6. The method of claim 3, wherein identifying the defective patterns comprises binary subtraction of the specimen signal image from the reference signal image.

7. The method of claim 3, further comprising measuring an intensity of a direct current passing through the defective patterns.

8. The method of claim 2, wherein inspecting the processing defects comprises:
classifying the grounded and floating conductive lines into a plurality of inspection units, each of which comprises a pair of one of the grounded conductive lines and one of the floating conductive lines, a first conductive plug electrically connected to the grounded conductive lines and a second conductive plug electrically connected to the floating conductive lines, a specimen unit in which the first and second conductive plugs are spaced apart from each other by a standard distance and a reference unit in which the first and second conductive plugs are spaced apart from each other by a reference distance;
generating a reference signal image corresponding to a reference signal generated from the reference unit and a specimen signal image corresponding to a specimen signal generated from the specimen unit; and
identifying the supplementary patterns in the specimen unit as defective patterns when the reference signal image and the specimen signal image are different from each other in the inspection unit.

9. The method of claim 8, wherein generating the reference signal image and the specimen signal image comprises:
detecting secondary electrons generated from the grounded conductive lines and the floating conductive lines by the electron beam;
measuring voltages of the grounded and the floating conductive lines in the reference and the specimen units; and
displaying each of the voltages as a visual image in accordance with the reference and the specimen units, to thereby generate the reference signal image indicating the voltage measured from the grounded and the floating conductive lines of the reference unit, and the specimen signal image indicating the voltage measured from the grounded and the floating conductive lines of the specimen unit.

10. The method of claim 9, wherein the specimen signal image and the reference signal image are displayed alternately with each other to facilitate voltage contrast analysis between the specimen signal image and the reference signal image adjacent to each other.

11. The method of claim 10, wherein identifying the defective patterns comprises a binary subtraction of the specimen signal image from the reference signal image.

12. The method of claim 9, wherein determining the allowable process margin comprises:
comparing the measuring gap distances of the defective patterns; and
selecting a maximum or a minimum measuring gap distance of the defective patterns.

13. The method of claim 1, wherein determining the allowable process margin comprises:
comparing the sizes of defective patterns; and
selecting a maximum or a minimum size of the defective patterns.

14. The method of claim 13:
wherein the supplementary patterns in the specimen unit comprise a first supplementary conductive line extending from the grounded conductive lines to the floating conductive lines and a second supplementary conductive line extending from the floating conductive lines to the grounded conductive lines in parallel with the first supplementary conductive line and spaced apart from the first supplementary conductive line by a first distance; and
wherein the sizes of the defective patterns comprise widths of the first and second supplementary conductive lines and the first distance.

15. The method of claim 14:
wherein each of the supplementary patterns further comprises a third supplementary conductive line between the first and second supplementary conductive lines in parallel with the first and the second supplementary conductive lines and spaced apart from the first and the second supplementary conductive lines by a second distance in such a manner that a first end portion is connected to an end portion of the first supplementary conductive line and a second end portion opposite to the first end portion is connected to an end portion of the second supplementary conductive line; and
wherein sizes of the defective patterns further comprise a width of the third supplementary conductive line and the second distance.

16. The method of claim 14:
wherein each of the supplementary patterns further comprises a first conductive connector that is electrically connected to the first supplementary conductive line, a second conductive connector that is electrically connected to the second supplementary conductive line and a fourth supplementary conductive line that is electrically connected with the first and second conductive connectors; and
wherein the sizes of the defective patterns further comprise a gap distance between edge portions of the fourth conductive line and the first conductive connector or between edge portions of the fourth conductive line and the second conductive connector.

* * * * *